US009670702B2

(12) United States Patent
Sugita et al.

(10) Patent No.: US 9,670,702 B2
(45) Date of Patent: Jun. 6, 2017

(54) LOCK CONTROL DEVICE FOR VEHICLE

(71) Applicant: HONDA MOTOR CO., LTD., Tokyo (JP)

(72) Inventors: Masashi Sugita, Utsunomiya (JP); Shinichi Arie, Utsunomiya (JP); Katsuyasu Yamane, Utsunomiya (JP); Masayuki Yamazaki, Utsunomiya (JP)

(73) Assignee: HONDA MOTOR CO., LTD., Tokyo (JP)

( * ) Notice: Subject to any disclaimer, the term of this patent is extended or adjusted under 35 U.S.C. 154(b) by 25 days.

(21) Appl. No.: 14/762,686

(22) PCT Filed: Feb. 13, 2013

(86) PCT No.: PCT/JP2013/053342
§ 371 (c)(1),
(2) Date: Jul. 22, 2015

(87) PCT Pub. No.: WO2014/125577
PCT Pub. Date: Aug. 21, 2014

(65) Prior Publication Data
US 2015/0368935 A1 Dec. 24, 2015

(51) Int. Cl.
*E05B 41/00* (2006.01)
*E05B 81/76* (2014.01)
(Continued)

(52) U.S. Cl.
CPC .............. *E05B 81/77* (2013.01); *E05B 41/00* (2013.01); *E05B 81/76* (2013.01); *E05B 85/107* (2013.01); *E05B 85/16* (2013.01); *Y10T 70/625* (2015.04)

(58) Field of Classification Search
CPC ...... G07C 9/00309; G07C 2009/00793; G07C 9/00174; G07C 2209/63; G07C 9/00944;
(Continued)

(56) References Cited

U.S. PATENT DOCUMENTS 7,212,658 B2 * 5/2007 Du .................... G06K 9/00026 382/115
7,375,299 B1 * 5/2008 Pudney .................... H01H 9/06 200/61.62
(Continued)

FOREIGN PATENT DOCUMENTS

JP 2526106 5/1996
JP 2006-009352 1/2006
(Continued)

OTHER PUBLICATIONS

International Search Report dated Apr. 16, 2013, Application No. PCT/JP2013/053342, English translation included, 4 pages.
(Continued)

*Primary Examiner* — Mark Blouin
(74) *Attorney, Agent, or Firm* — Rankin, Hill & Clark LLP

(57) ABSTRACT

A lock control device of a vehicle includes: a door lock device that causes a door of the vehicle to be in an unlocked state or a locked state; a door handle that is operated in order to allow the door to become an open state from a closed state; a sensor array that is provided in the vicinity of the door handle and that is arranged with a plurality of contact detection sensors; and a main controller that controls the door lock device to be in the unlocked state when the plurality of contact detection sensors sequentially detect the contact in a first direction which is a direction from the sensor array toward the door handle.

18 Claims, 8 Drawing Sheets

(51) Int. Cl.
*E05B 85/16* (2014.01)
*E05B 85/10* (2014.01)

(58) Field of Classification Search
CPC .......... G07C 2009/00261; G07C 2009/00507; G07C 2209/65; G07C 9/00111
USPC ........................................................ 340/5.72
See application file for complete search history.

(56) References Cited

U.S. PATENT DOCUMENTS

| | | | | |
|---|---|---|---|---|
| 7,597,250 | B2 * | 10/2009 | Finn | B60R 25/25 235/375 |
| 7,635,210 | B2 * | 12/2009 | Metros | B60Q 1/2669 296/146.1 |
| 8,410,897 | B2 * | 4/2013 | Popelard | B60R 25/246 340/5.2 |
| 8,634,605 | B2 * | 1/2014 | Valfridsson | G06K 9/00026 340/5.83 |
| 8,648,832 | B2 * | 2/2014 | Maloof | H03K 17/9622 178/18.05 |
| 8,701,353 | B2 * | 4/2014 | Patel | E05B 81/34 292/144 |
| 2005/0285717 | A1 | 12/2005 | Ieda et al. | |

FOREIGN PATENT DOCUMENTS

| | | |
|---|---|---|
| JP | 2008-248631 | 10/2008 |
| JP | 2009-079353 | 4/2009 |
| JP | 2009-293187 | 12/2009 |
| JP | 2010-090629 | 4/2010 |
| JP | 2011-175736 | 9/2011 |

OTHER PUBLICATIONS

Japanese Office Action dated Feb. 9, 2016 (English translation included).
Japanese Notice of Allowance dated Sep. 27, 2016 (English translation included).

* cited by examiner

LOCK CONTROL DEVICE FOR VEHICLE

TECHNICAL FIELD

The present invention relates to a lock control device for a vehicle.

BACKGROUND ART

In the related art, a device is known which includes a plurality of sensor electrodes which are installed to be arranged on the upper surface of a door handle provided in a door of a vehicle, and controls the operation of a lock device of the vehicle when a detection signal which is coincident with a reference detection pattern such as a contact in a predetermined contact order with respect to the plurality of sensor electrodes is detected (for example, refer to Patent Document 1).

PRIOR ART DOCUMENTS

Patent Documents

[Patent Document 1] Japanese Unexamined Patent Application, First Publication No. 2010-90629

SUMMARY OF INVENTION

Problems to be Solved by the Invention

However, in a device according to the related art, a combination between the number of times of slide operations and an operation time or a combination between operations in different directions, and the controls of various lock modes are only associated with each other, and thus, there are problems that it is difficult to memorize the operation pattern and the operation proficiency level is low.

The present invention is made in consideration of the above-described circumstances, and an object thereof is to provide a lock control device for a vehicle in which an operator who operates a state of a door lock device can easily understand an operation method and can easily memorize the operation method.

Means for Solving the Problem

In order to solve the above-described problems and achieve the related object, the present invention adopts the following aspects.

(1) According to a first aspect of the present invention, there is provided a lock control device for a vehicle, including: a door lock device that is configured to cause a door of the vehicle to be in an unlocked state or a locked state; a door handle that is provided on an outer plate of the door, and that is configured to be operated in order to allow the door to become an open state from a closed state; a sensor array that is provided on the outer plate of the door in the vicinity of the door handle and that is arranged with a plurality of contact detection sensors which are capable of detecting a contact with a predetermined detection object; and a controller that is configured to control the door lock device to be in the unlocked state when the contact detection sensors of the sensor array sequentially detect the contact in a first direction which is a direction from the sensor array toward the door handle.

(2) In the lock control device for a vehicle described in (1), the controller may be configured to control the door lock device to be in the locked state when the contact detection sensors sequentially detect the contact in a second direction which is a direction opposite to the first direction.

(3) In the lock control device for a vehicle described in (1) or (2), the door handle may be configured to be changeable between an accommodation state and a holdable state, and includes a pressing part which is configured to change the holding part from the accommodation state to the holdable state, the accommodation state being a state in which a holding part held during the operation is accommodated in the outer plate of the door, the holdable state being a state in which the holding part protrudes from the outer plate of the door so as to be held, the pressing part being arranged on an end part of the door handle which is at a side closer to the sensor array in a longitudinal direction.

(4) In the lock control device for a vehicle described in (1) or (2), the door handle may be configured to be changeable between an accommodation state, and a holdable state, and includes an actuator which is configured to change the holding part from the accommodation state to the holdable state, the accommodation state being a state in which a holding part held during the operation is accommodated in the outer plate of the door, the holdable state being a state in which the holding part is protruded from the outer plate of the door so as to be held, and wherein the controller may be configured to change the actuator to be in the holdable state when the contact detection sensors sequentially detect the contact in the first direction.

(5) In the lock control device for a vehicle described in (2), the lock control device for a vehicle may further include a key cylinder into which a mechanical key which operates the door lock device by mechanical rotation can be inserted, the key cylinder being arranged on the outer plate of the door, and a corresponding relationship between a rotation direction of the mechanical key, and the unlocked state and the locked state of the door lock device, and a corresponding relationship between the first direction and the second direction, and the unlocked state and the locked state of the door lock device may be configured to be the same as each other.

(6) In the lock control device for a vehicle described in any one of (1) to (5), the lock control device for a vehicle may further include a light emitting part that is configured to emit light which is visible from outside, the light emitting part being arranged in the vicinity of the sensor array, wherein the controller may be configured to cause the light emitting part to emit light with different colors associated with the unlocked state and the locked state in advance for a predetermined period of time after the controller has performed the control of the door lock device to be in the unlocked state or the locked state.

(7) In the lock control device for a vehicle described in any one of (1) to (5), the lock control device for a vehicle may further include a light emitting part that is arranged in the vicinity of the sensor array and that is configured to emit light which is visible from the outside; and an approach detection part that is configured to detect that a portable device possessed by an owner of the vehicle has approached the vehicle, wherein the controller may be configured to cause the light emitting part to emit light when the approach detection part detects that the portable device has approached the vehicle.

(8) In the lock control device for a vehicle described in any one of (1) to (7), the plurality of contact detection sensors may be arranged in a direction along the longitudinal direction of the door handle, and the sensor array may be arranged to be adjacent to the door handle.

(9) In the lock control device for a vehicle described in any one of (1) to (8), the lock control device for a vehicle may further include a design part that is configured to display a predetermined design on a front surface of the sensor array by a graphic form or a character, and, when viewed from a front of the sensor array, both ends of the design part in a direction along the first direction may be configured to be locate more outside than both ends of the sensor array in the direction along the first direction.

Effects of the Invention

According to the lock control device for a vehicle according to the aspect described in (1), a positional relationship (that is, a disposition order) between the operation objects (that is, the sensor array and the door handle) is associated with the slide operation direction detected by the sensor array. Accordingly, an operator who operates the door lock device can easily understand the operation method, and can easily memorize the operation method.

Moreover, in the case of (2), since the slide operation directions in the unlocked state and the locked state are opposite to each other, the operator can easily distinguish the operation methods of the unlocked state and the locked state, and can easily memorize the operation methods.

Moreover, in the case of (3), the operator can perform an operation of pressing the pressing part in a series of flow of the slide operation for unlocking the door lock device. Accordingly, it is possible to improve operability.

In addition, in the case of (4), since the door handle protrudes when the slide operation for unlocking the door lock device is detected, it is possible to improve antitheft performance.

In addition, in the case of (5), an occupant can more easily understand the operation method, and can easily memorize the operation method.

Moreover, in the case of (6), since the operation result during a predetermined period of time after the operation can be displayed, it is possible to improve convenience.

In addition, in the case of (7), since it is possible to display the operation position of the sensor array in a dark location, it is possible to further improve convenience.

In addition, in the case of (8), it is possible to improve design ability and operability.

Moreover, in the case of (9), a detection object can come into contact with all the contact detection sensors during the slide operation.

DESCRIPTION OF EMBODIMENTS

Hereinafter, an embodiment of a lock control device for a vehicle of the present invention will be described with reference to the accompanying drawings.

Figure 1:
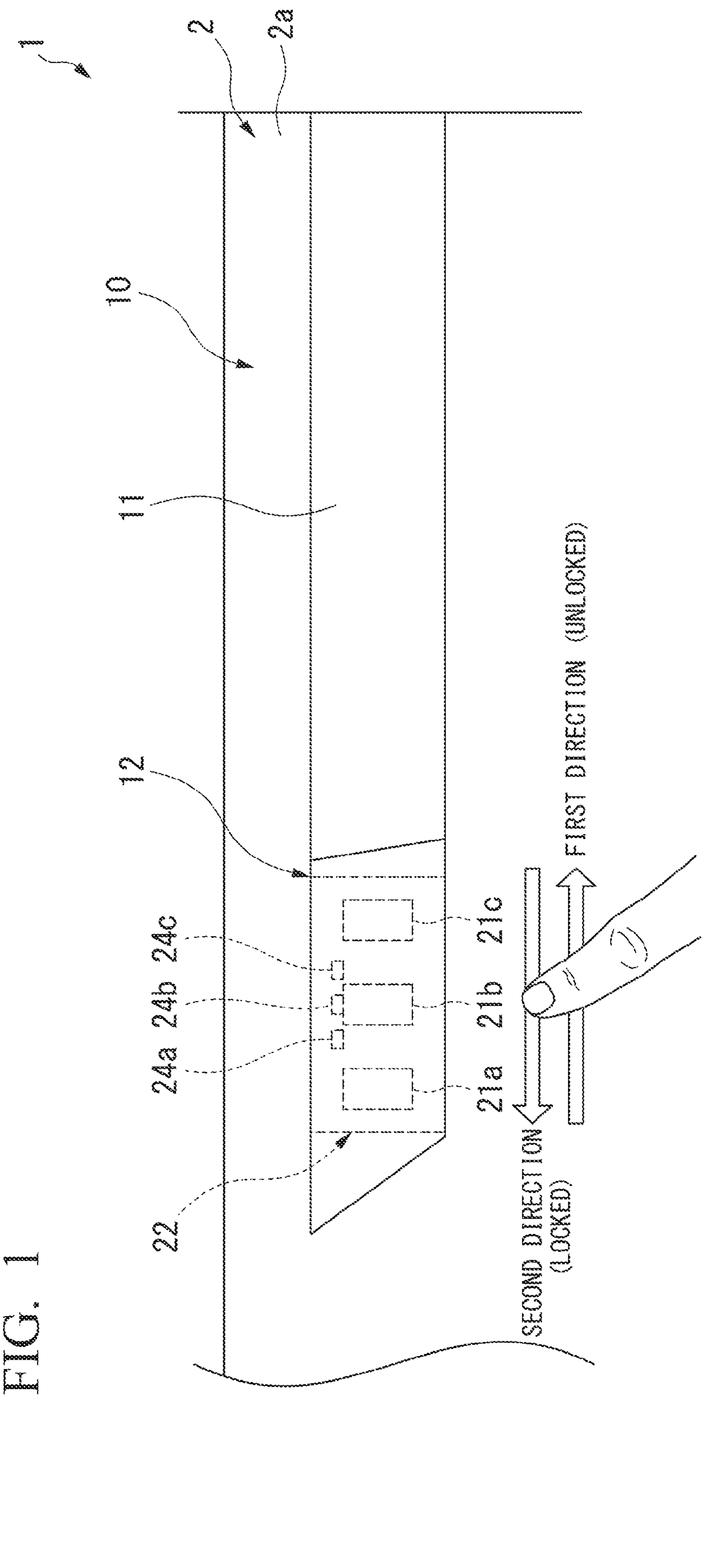
FIG. 1 is a view showing a detection part and a door handle of a lock control device for a vehicle according to an embodiment of the present invention.
Figure 2:
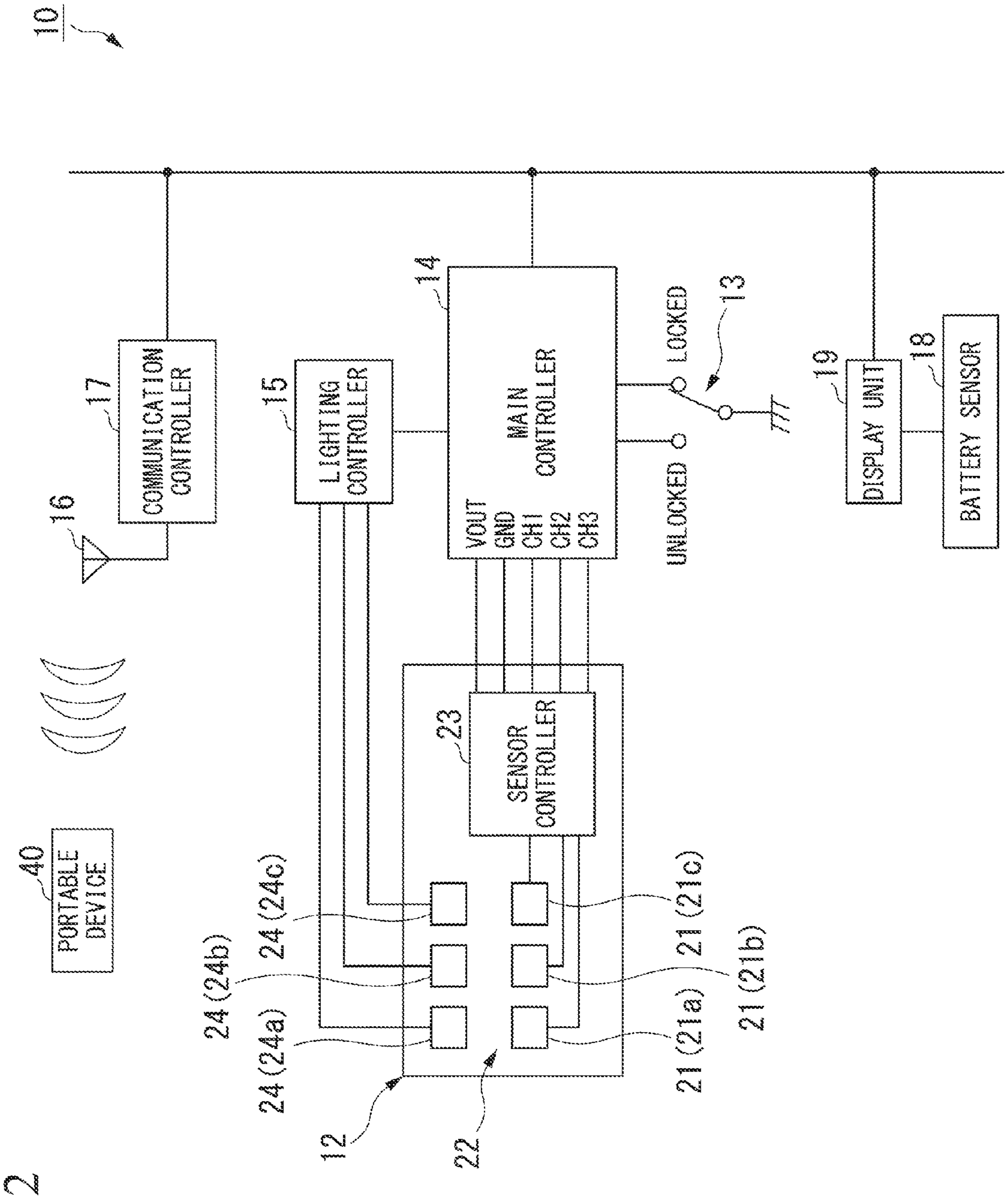
FIG. 2 is a configuration view of the lock control device for a vehicle according to the embodiment of the present invention.

As shown in FIG. 1, a lock control device 10 for a vehicle according to the present embodiment includes a door handle 11 which is provided on an outer plate 2*a* of a door 2 of a vehicle 1 and is operated to allow the door 2 to move from a closed state to an open state, and a detection part 12 which is provided on the outer plate 2*a* of the door 2 in the vicinity of the door handle 11. In addition, as shown in FIG. 2, the lock control device 10 for a vehicle includes a door lock device 13 which causes the door 2 of the vehicle 1 to be in an unlocked state or a locked state, and a main controller 14 which controls the door lock device 13. Moreover, the lock control device 10 for a vehicle includes a lighting controller 15 which controls light-emitting of the detection part 12, a communicator 16, a communication controller 17, a battery sensor 18, and a display unit 19.

Figure 3:
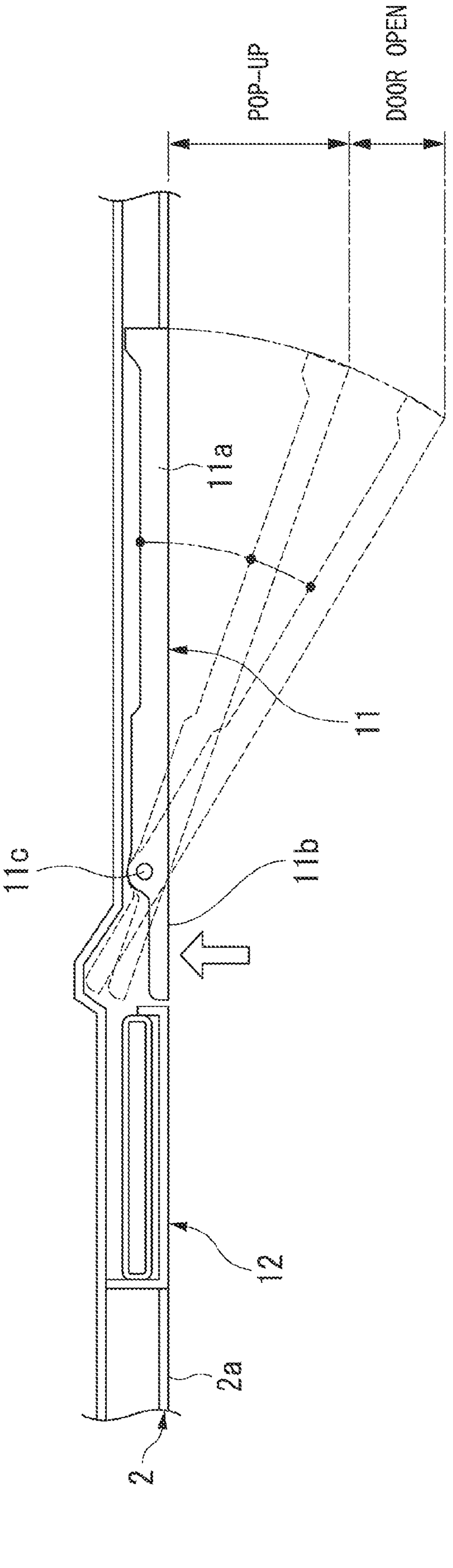
FIG. 3 is a cross-sectional view of the detection part and the door handle of the lock control device for a vehicle according to the embodiment of the present invention.

As shown in FIG. 3, the door handle 11 includes a holding part 11*a*, a supporting part 11*c*, and a pressing part 11*b* which are sequentially formed from a first direction toward a second direction in a longitudinal direction of the door handle 11. The door handle 11 is capable to rotate about the supporting part 11*c* which is rotatably supported by the door 2 between the holding part 11*a* and the pressing part 11*b*.

The door handle 11 rotates about the supporting part 11*c*, and thus, the holding part 11*a* is changeable between a state where the holding part is accommodated with respect to the outer plate 2*a* of the door 2 and a state in which the holding part protrudes from the outer plate 2*a* of the door 2 so as to be held. When an operator operates the door 2 from a closed state to an open state, since the holding part 11*a* protrudes from the outer plate 2*a* of the door 2 so as to be held, the holding part is held by the operator.

The pressing part 11*b* is provided at the end of the side close to the detection part 12 (more specifically, a sensor array 22 described below) in the longitudinal direction of the door handle 11. When the holding part 11*a* accommodated in the outer plate 2*a* of the door 2 protrudes from the outer plate 2*a*, the pressing part 11*b* is operated to be pressed by the operator. More specifically, the pressing part 11*b* is rotated about the supporting part 11*c* according to a pressing operation of the operator in a direction from the outside of the door 2 toward the inner side of the door in the state where the holding part 11*a* is accommodated in the outer plate 2*a* of the door 2, and thus, the holding part 11*a* is protruded from the outer plate 2*a*.

Accordingly, the door handle 11 is changeable between the accommodation state in which the holding part 11*a* is accommodated in the outer plate 2*a* of the door 2, and the holdable state in which the holding part 11a protrudes from the outer plate 2a of the door 2 so as to be held. In addition, the door handle 11 is changeable from the holdable state (pop-up state), in which when the door 2 is in the closed state the holding part 11a protrudes from the outer plate 2a of the door 2 so as to be held, to a door open state, in which the door 2 is made to a opened state. That is, the holding part 11a is further displaced in the direction, in which the holding part 11a protrudes from the outer plate 2a of the door 2, from the pop-up state in the closed state of the door 2 by the operation of the operator, and thus, the door 2 is switched from the closed state to the open state (door open state).

The detection part 12 is disposed to be adjacent to the door handle 11 in the second direction in the longitudinal direction of the door handle 11.

Figure 4:
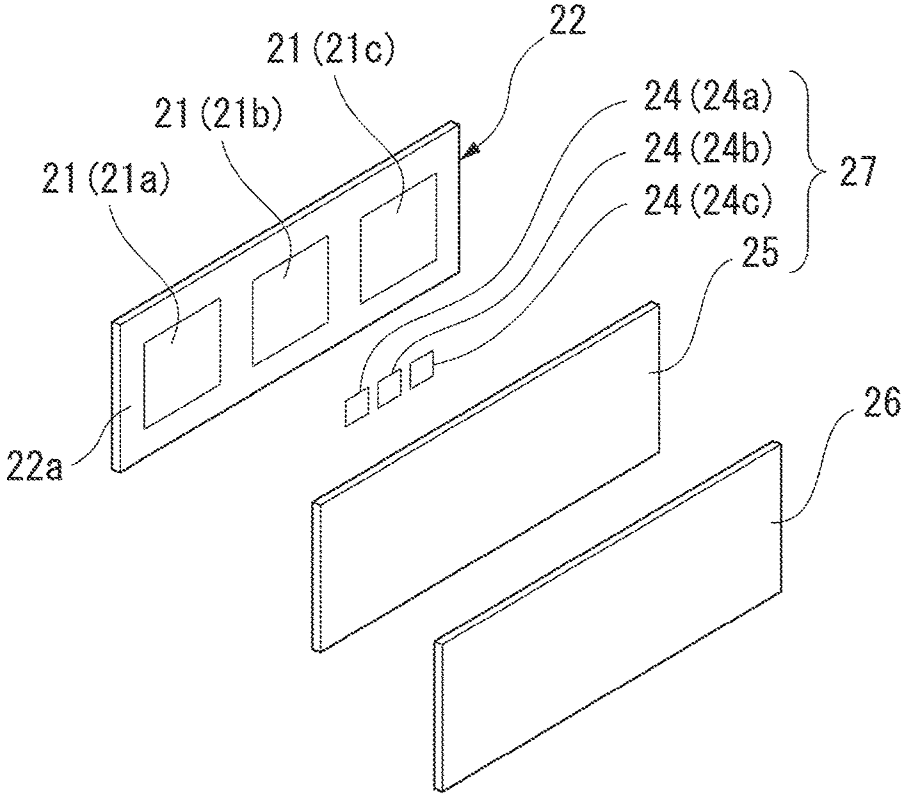
FIG. 4 is an exploded perspective view showing the configuration of the detection part of the lock control device for a vehicle according to the embodiment of the present invention.

As shown in FIG. 2, the detection part 12 includes a sensor array 22 in which a plurality of contact detection sensors 21 (for example, first to third contact detection sensors 21a, 21b, and 21c) are arranged next to each other, a sensor controller 23, and three light-emitting elements 24 (first to third light-emitting elements 24a, 24b, and 24c). In addition, as shown in FIG. 4, the detection part 12 includes a diffusion plate 25 which diffuses light by light-emitting of the first to third light-emitting elements 24a, 24b, and 24c, and a cover 26.

For example, the contact detection sensor 21 is an electrostatic touch sensor, detects the contact of a predetermined detection object such as fingers of the operator, and outputs signals of the detection result.

As shown in FIG. 1, in the sensor array 22, the first, second, third contact detection sensors 21a, 21b, and 21c are disposed to be sequentially arranged on a substrate 22a along the first direction from the sensor array 22 toward the door handle 11 in the longitudinal direction of the door handle 11.

Accordingly, for example, if the predetermined detection object such as the fingers of the operator moves in a contact manner (moves in a slide manner) from the first contact detection sensor 21a toward the third contact detection sensor 21c in the direction along the first direction in the longitudinal direction of the door handle 11 on the outer surface (front surface) of the detection part 12, the first, second, and third contact detection sensors 21a, 21b, and 21c sequentially detect the contact of the predetermined detection object.

On the other hand, for example, if the predetermined detection object such as the fingers of the operator moves in a contact manner (moves in a slide manner) from the third contact detection sensor 21c toward the first contact detection sensor 21a in the direction along the second direction in the longitudinal direction of the door handle 11 on the outer surface (front surface) of the detection part 12, the third, second, and first contact detection sensors 21c, 21b, and 21a sequentially detect the contact of the predetermined detection object.

The sensor controller 23 is connected to a voltage output terminal (VOUT) and a grounding terminal (GND) of the main controller 14, and a predetermined voltage is applied to the first to third contact detection sensors 21a, 21b, and 21c. The sensor controller 23 is connected to first to third input terminals (CH1, CH2, and CH3) of the main controller 14, and outputs the detection signals output from the first to third contact detection sensors 21a, 21b, and 21c to the first to third terminals (CH1, CH2, and CH3) of the main controller 14.

For example, the light-emitting element 24 is a light-emitting diode or the like, and is disposed on the substrate 22a of the sensor array 22. The lighting of the light-emitting element 24 is controlled by the lighting controller 15.

As shown in FIG. 4, the diffusion plate 25 is disposed so as to be stacked on the substrate 22a of the sensor array 22, and diffuses the light generated by the light-emitting of the light-emitting element 24.

Accordingly, the first to third light emitting elements 24a, 24b, and 24c and the diffusion plate 25 form a light emitting part 27, and the light emitting part 27 is disposed in the vicinity of the sensor array 22, for example, at the position at which the sensor array 22 and the light emitting part 27 approximately overlap each other in a front view of the sensor array 22.

Figure 5:
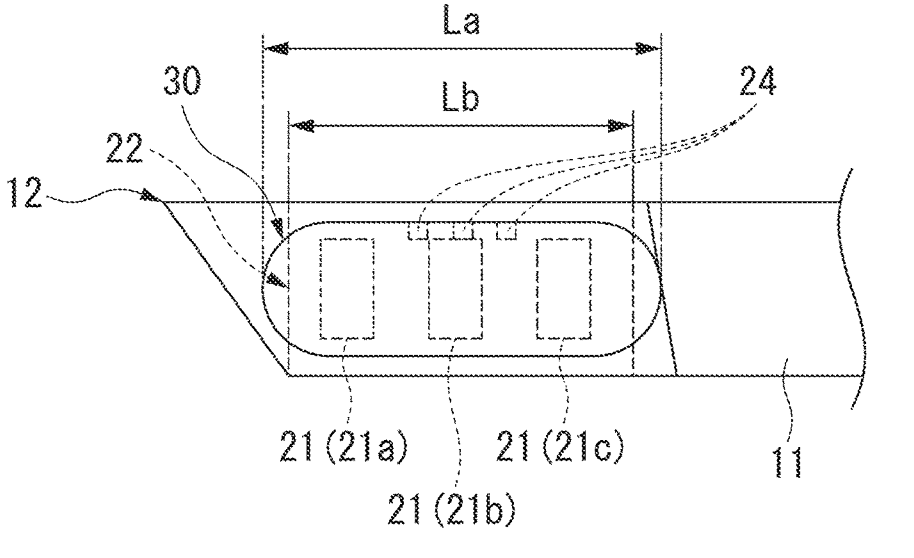
FIG. 5 is a front view of the detection part of the lock control device for a vehicle according to the embodiment of the present invention.

The cover 26 covers the diffusion plate 25, and is disposed to form the outer surface (front surface) of the detection part 12. For example, the cover 26 is a film formed of a transparent resin or the like, and is formed of a material having predetermined transmittance so that the light emitting part 27 is visible from the outside. In addition, as shown in FIG. 5, a design part 30 which displays a predetermined design by a graphic form or a character is provided on the surface of the cover 26 which forms the outer surface (front surface) of the detection part 12. In addition, a length La of the design part 30 is formed to be longer than a length Lb of the sensor array 22 in the direction along the longitudinal direction (that is, along the first direction or the second direction opposite to the first direction) of the door handle 11. Moreover, in a front view of the sensor array 22, both ends in the direction along the first direction or the second direction of the design part 30 are formed outside than both ends of the sensor array 22 in the direction along the first direction or the second direction.

The door lock device 13 causes the door 2 of the vehicle 1 to be in the unlocked state or the locked state according to the control of the main controller 14.

The main controller 14 controls the door lock device 13 and the lighting controller 15 based on the signals input to the first to third input terminals (CH1, CH2, and CH3) by the sensor controller 23. Moreover, the main controller 14 controls the door lock device 13 and the lighting controller 15 based on the signals input from the communication controller 17.

For example, when the first, second, and third contact detection sensors 21a, 21b, and 21c sequentially detect the contact of the predetermined detection object in the direction along the first direction from the sensor array 22 toward the door handle 11, the main controller 14 controls the door lock device 13 to be in the unlocked state. In addition, during a predetermined period of time (for example, during 3 seconds or the like) after the door lock device 13 is controlled to be in the unlocked state, the main controller instructs the lighting controller 15 to allow the light emitting part 27 to emit light with a predetermined color (for example, blue or the like) associated with the unlocked state by causing the first light-emitting element 24a to emit light.

In addition, when the third, second, and first contact detection sensors 21c, 21b, and 21a sequentially detect the contact of the predetermined detection object in the direction along the second direction opposite to the first direction, the main controller 14 controls the door lock device 13 to be in the locked state. In addition, during a predetermined period of time (for example, during 3 seconds or the like) after the door lock device 13 is controlled to be in the locked state, the main controller instructs the lighting controller 15 to allow the light emitting part 27 to emit light with a predetermined color (for example, red or the like) associated with the locked state by causing the second light-emitting element 24*b* to emit light.

For example, when the communication controller 17 detects that a portable device 40 wirelessly communicable with the communicator 16 approaches the vehicle 1, the main controller 14 causes the third light-emitting element 24*c* to emit light during a predetermined period of time (for example, 30 seconds). Accordingly, the main controller 14 instructs the lighting controller 15 to allow the light emitting part 27 to emit light with a predetermined color associated with the approached state such as a different color (for example, white) from the color which is associated with the unlocked state or the locked state of the door lock device 13, or with a same color (for example, blue which is the same as the color associated with the unlocked state, red which is the same as the color associated with the locked state, or the like) which is the same as the color associated with the state of the door lock device 13 when the approach of the portable device 40 to the vehicle 1 is detected.

Moreover, when the portable device 40 instructs the door lock device 13 to be in the unlocked state, the main controller 14 controls the door lock device 13 to be in the unlocked state. In addition, the main controller 14 instructs the lighting controller 15 to allow the light emitting part 27 to emit light with the predetermined color (for example, blue or the like) associated with the unlocked state by causing the first light-emitting element 24*a* to emit light during a predetermined period of time (for example, during 3 seconds or the like) after the door lock device 13 is controlled to be in the unlocked state.

Moreover, when the portable device 40 instructs the door lock device 13 to be in the locked state, the main controller 14 controls the door lock device 13 to be in the locked state. In addition, the main controller 14 instructs the lighting controller 15 to allow the light emitting part 27 to emit light with the predetermined color (for example, red or the like) associated with the locked state by causing the second light-emitting element 24*b* to emit light during a predetermined period of time (for example, during 3 seconds or the like) after the door lock device 13 is controlled to be in the locked state.

Moreover, in a case where an ignition switch of the vehicle 1 is turned on (IGON) even before a predetermined period of time elapses when the light-emitting of the light emitting part 27 is performed by lighting of the first to third light-emitting elements 24*a*, 24*b*, and 24*c*, the main controller 14 stops the light-emitting of the light emitting part 27 by turning off the first to third light-emitting elements 24*a*, 24*b*, and 24*c*.

Moreover, the main controller 14 receives the signals of the detection result output from a battery sensor 18 detecting the state of a battery (not shown) serving as a power source of the vehicle 1, via a display unit 19 which performs display corresponding to the signals. Moreover, the main controller 14 determines whether or not the light emitting part 27 emits light according to the state of the battery.

For example, the display unit 19 is a lighting body which emits light with a predetermined color, a display which performs various display on a meter panel or the like including a vehicle speedometer, a rotation number meter, or the like in an instrument panel, or the like.

The lighting controller 15 controls the lighting of the first to third light-emitting elements 24*a*, 24*b*, and 24*c* according to the instruction of the main controller 14. Moreover, the lighting colors of the first to third light-emitting elements 24*a*, 24*b*, and 24*c* may be different from one another, the lighting colors of at least the first and second light-emitting elements 24*a* and 24*b* may be different from each other, and the lighting color of the third light-emitting element 24*c* may be the same as the lighting color of the second light-emitting element 24*b*. Accordingly, the colors associated with at least the unlocked state and the locked state of the door lock device 13 are different from each other, and the color associated with the approaching state of the portable device 40 is different from the colors associated with the unlocked state and the locked state or is the same as the color associated with the locked state.

For example, the communicator 16 and the portable device 40 configure a system which can remotely control the door lock device 13, such as a keyless entry system.

For example, the communicator 16 intermittently sends a request signal, and the portable device 40 receiving the request signal sends a signal including intrinsic identification information to the portable device 40 as a response signal which responds to the request signal. Moreover, according to a predetermined operation or the like of the operator with respect to the portable device 40, the portable device 40 sends the signal, which instructs the door lock device 13 to be in the unlocked state or the locked state, to the communicator 16. When the communicator 16 receives the signal sent from the portable device 40, the communicator outputs the received signal to the communication controller 17.

The communication controller 17 stores the intrinsic identification information with respect to the portable device 40 possessed by the owner of the vehicle 1 in advance, and determines whether or not the identification information received by the communicator 16 and the identification information stored in advance are coincident with each other. Moreover, when the received identification information and the stored identification information are coincident with each other, the communication controller 17 detects the approaching of the portable device 40 with respect to the vehicle 1 based on the change in received intensity of the signal sent from the portable device 40, or the like, and outputs the signal of the detection result to the main controller 14. In addition, when the signal, which instructs the door lock device 13 to be in the unlocked state or the locked state, is received by the communicator 16, the communication controller 17 outputs the signal to the main controller 14.

The lock control device 1 for a vehicle according to the present embodiment includes the above-described configuration, and next, the operation of the lock control device 1 for a vehicle will be described.

Figure 6:
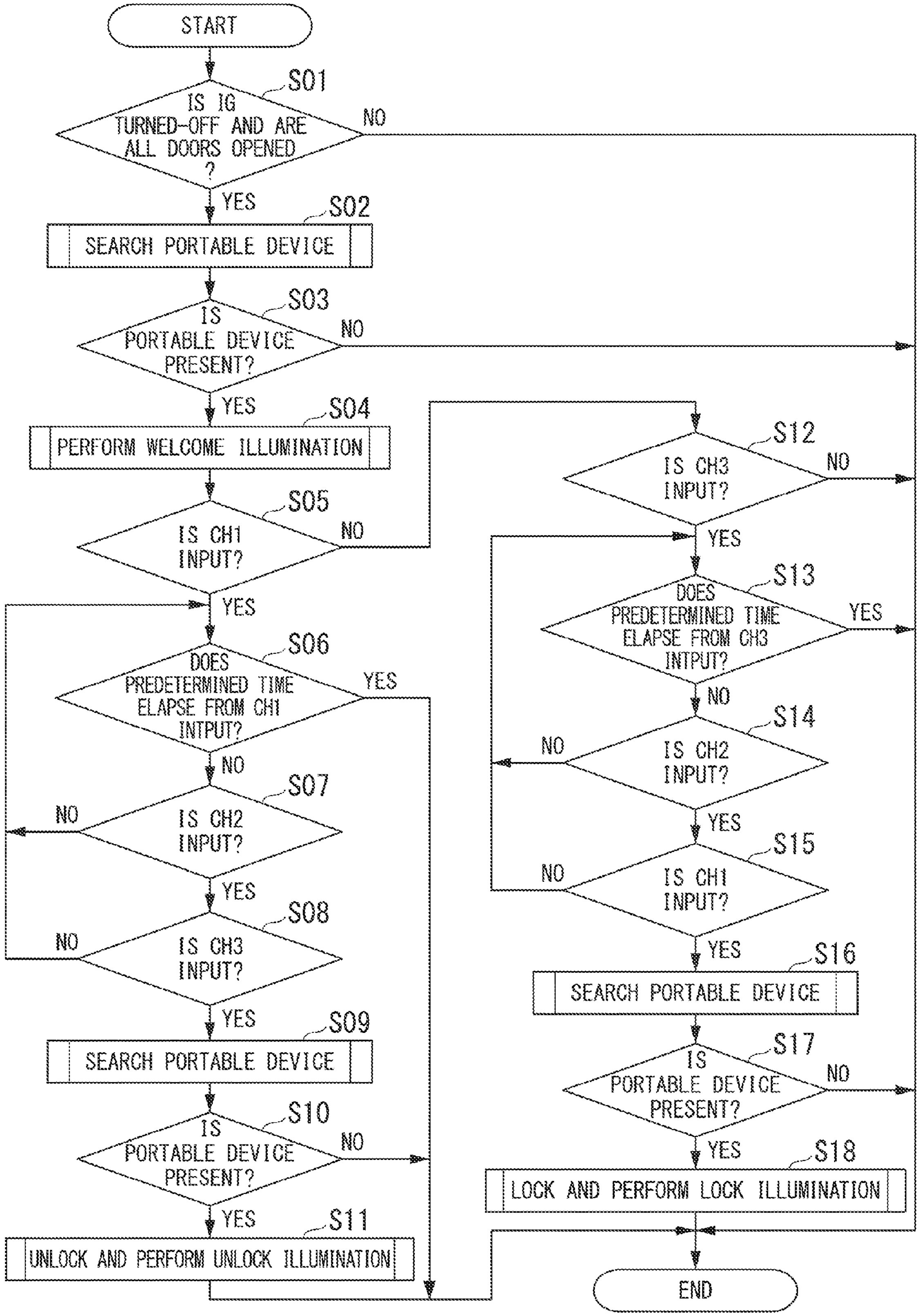
FIG. 6 is a flowchart showing the operation of the lock control device for a vehicle according to the embodiment of the present invention.

First, in Step S01 shown in FIG. 6, it is determined whether or not the ignition switch of the vehicle 1 is turned off (IGOFF) and whether or not all doors 2 of the vehicle 1 are in the closed states.

When the determination result is "NO", the process ends.

On the other hand, when the determination result is "YES", the process proceeds to Step S02.

Moreover, in Step S02, the portable device 40 having the same identification information as the identification information stored in advance is searched (retrieval) within a predetermined range in the surrounding of the vehicle 1 by a determination processing of whether or not the response signal of the portable device 40 responding to the request signal intermittently sent from the communicator 16 is received.

Subsequently, in Step S03, it is determined whether or not the portable device 40 having the same identification information as the identification information stored in advance is present within the predetermined range in the surrounding of the vehicle 1.

When this determination result is "NO", the process ends.

On the other hand, when the determination result is "YES", the process proceeds to Step S04.

In addition, in Step S04, the third light-emitting element 24*c* is lighted as a welcome illumination during a predetermined period of time (for example, during 30 seconds or the like), and thus, the light emitting part 27 emits light with the predetermined color associated with the approaching state of the portable device 40.

Subsequently, in Step S05, it is determined whether or not the predetermined signal indicating that the first contact detection sensor 21*a* has detected the contact between the predetermined object and the first contact detection sensor is input to the first input terminal CH1 of the main controller 14 from the sensor controller 23.

When the determination result is "NO", the process proceeds to Step S12 described below.

Figure 7:
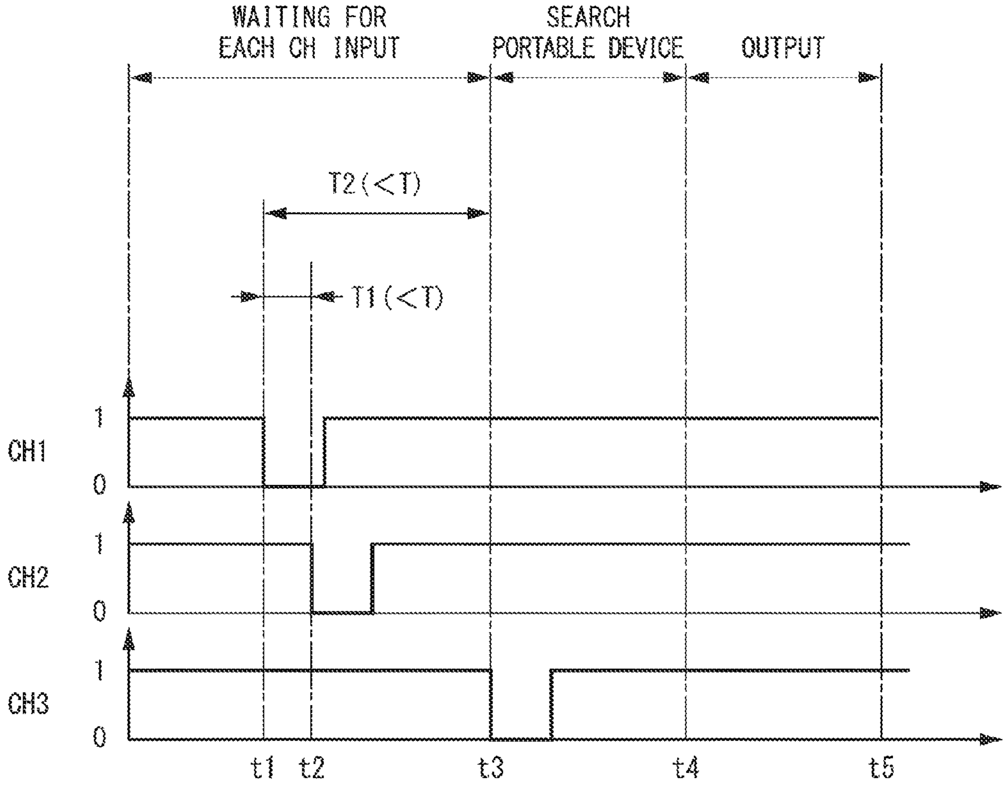
FIG. 7 is a view showing an example of a change of signals output from three contact detection sensors of the lock control device for a vehicle according to the embodiment of the present invention.

On the other hand, when the determination result is "YES", for example, as a time t1 shown in FIG. 7, in a case where a negative edge signal is input to the first input terminal CH1, the process proceeds to Step S06.

Subsequently, in Step S05, it is determined whether or not a predetermined period of time T (for example, 500 ms, or the like) elapses after the predetermined signal is input to the first input terminal CH1.

When the determination result is "YES", the process ends.

On the other hand, when the determination result is "NO", the process proceeds to Step S07.

Moreover, in Step S07, it is determined whether or not the predetermined signal indicating that the second contact detection sensor 21*b* has detected the contact between the predetermined object and the second contact detection sensor is input to the second input terminal CH2 of the main controller 14 from the sensor controller 23.

When the determination result is "NO", the process returns to the above-described Step S06.

On the other hand, when the determination result is "YES", for example, at a time t2 shown in FIG. 7, in a case where the negative edge signal is input to the second input terminal CH2 during an elapsed time T1 which is shorter than the predetermined time T from the time t1, the process proceeds to Step S08.

Moreover, in Step S08, it is determined whether or not the predetermined signal indicating that the third contact detection sensor 21*c* has detected the contact between the predetermined object and the third contact detection sensor is input to the third input terminal CH3 of the main controller 14 from the sensor controller 23.

When the determination result is "NO", the process returns to the above-described step S06.

On the other hand, when the determination result is "YES", for example, at a time t3 shown in FIG. 7, in a case where the negative edge signal is input to the third input terminal CH3 during an elapsed time T2 which is shorter than the predetermined T from the time t1, the process proceeds to Step S09.

In addition, in Step 09, for example, at a period between the time t3 and a time t4 shown in FIG. 7, the portable device 40 is searched (retrieval). More specifically, the request signal is sent from the communicator 16 according to the detection of the contact of the predetermined detection object in the direction along the first direction, and the portable device 40 having the same identification information as the identification information stored in advance is searched (retrieval) within the predetermined range in the vicinity of the vehicle 1 by the determination processing of whether or not the response signal of the portable device 40 responding to the request signal is received.

Subsequently, in Step S10, it is determined whether or not the portable device 40 having the same identification information as the identification information stored in advance is present within the predetermined range in the vicinity of the vehicle 1.

When this determination result is "NO", the process ends.

On the other hand, when the determination result is "YES", the process proceeds to Step S11.

In addition, in Step S11, for example, at a period between the time t4 and a time t5 shown in FIG. 7, the signal for controlling the door lock device 13 and the light emitting part 27 is output. More specifically, the door lock device 13 is controlled to be in the unlocked state. In addition, after the door lock device 13 is controlled to be in the unlocked state, during the predetermined period of time (for example, during 3 seconds, or the like), the first light-emitting element 24*a* is lighted as unlock illumination, and thus, the light emitting part 27 emits light with the color associated with the unlocked state in advance. Thereafter, the process ends.

Moreover, in Step S12, it is determined whether or not the predetermined signal indicating of the third contact detection sensor 21*c* detecting the contact between the predetermined detecting object and the third contact detection sensor is input to the third input terminal CH3 of the main controller 14 from the sensor controller 23.

When the determination result is "NO", the process ends.

On the other hand, when the determination result is "YES", the process proceeds to Step S13.

Subsequently, in Step S13, it is determined whether or not a predetermined time T (for example, 500 ms, or the like) elapses after the predetermined signal is input to the third input terminal CH3.

When the determination result is "YES", the process ends.

On the other hand, when the determination result is "NO", the process proceeds to Step S14.

Moreover, in Step S14, it is determined whether or not the predetermined signal indicating that the second contact detection sensor 21*b* has detected the contact between the predetermined detecting object and the second contact detection sensor is input to the second input terminal CH2 of the main controller 14 from the sensor controller 23.

When the determination result is "NO", the process returns to Step S13.

On the other hand, when the determination result is "YES", the process proceeds to Step S15.

Subsequently, in Step S15, it is determined whether or not the predetermined signal indicating that the first contact detection sensor 21*a* has detected the contact between the predetermined object and the first contact detection sensor is input to the first input terminal CH1 of the main controller 14 from the sensor controller 23.

When the determination result is "NO", the process proceeds to Step S13 described below.

On the other hand, when the determination result is "YES", the process proceeds to Step S16.

In addition, in Step S16, the request signal is sent from the communicator 16 according to the detection of the contact of the predetermined detection object in the direction along the second direction, and the portable device 40 having the same identification information as the identification information stored in advance is searched (retrieval) within the predetermined range in the surrounding of the vehicle 1 by the determination processing of whether or not the response signal of the portable device 40 responding to the request signal is received.

Subsequently, in Step S17, it is determined whether or not the portable device 40 having the same identification information as the identification information stored in advance is present within the predetermined range in the vicinity of the vehicle 1.

When this determination result is "NO", the process ends.

On the other hand, when the determination result is "YES", the process proceeds to Step S18.

Moreover, in Step S18, the door lock device 13 is controlled to be in the locked state. In addition, after the door lock device 13 is controlled to be in the locked state, during the predetermined period of time (for example, during 3 seconds, or the like), the second light-emitting element 24*b* is lighted as lock illumination, and thus, the light emitting part 27 emits light with the color associated with the locked state in advance. Thereafter, the process ends.

As described above, according to the lock control device 1 for a vehicle of the present embodiment, the order in the dispositions of the door handle 11 and the detection part 12 in the direction along the longitudinal direction of the door handle 11 and the direction of the contact operation (slide operation) detected by the sensor array 22 are associated with each other. More specifically, the direction along the first direction in the longitudinal direction of the door handle 11 is the direction in which the door handle 11 is disposed to be adjacent to the detection part 12, and is the direction of the contact portion detected by the sensor array 22 when the door lock device 13 is controlled to be in the unlocked state. Accordingly, the operator who operates the door lock device 13 easily understands the operation method, and can easily memorize the operation method. Moreover, it is possible to improve the design ability.

Moreover, since the operator can perform an operation of pressing the pressing part 11*b* of the door handle 11 in the series of flow of the slide operation for unlocking the door lock device 13, it is possible to improve operability.

Moreover, since the directions in the contact operations detected by the sensor array 22 in the unlocked state and the locked state of the door lock device 13 are opposite to each other, the operator can easily distinguish the operation methods of the unlocked state and the locked state, and can easily memorize the methods.

In addition, since the operation result is displayed by the light-emitting of the light emitting part 27 during the predetermined time after the locking and the unlocking of the door lock device 13 are operated, it is possible to improve convenience.

In addition, since the light emitting part 27 emits light when the portable device 40 possessed by the owner of the vehicle 1 approaches the vehicle 1, it is possible to display the operation position of the sensor array 22 in a dark location, and thus, it is possible to further improve convenience.

Moreover, since the length La of the design part 30 is longer than the length Lb of the sensor array 22, when the slide operation is performed on the design part 30, all contact detection sensors 21 of the sensor array 22 can come into contact with the predetermined detection object.

In addition, in the above-described embodiment, the processing of Step S04 may be omitted. In addition, in this case, the processing of Step S02 and Step S03 may be omitted. That is, the welcome illumination may be omitted, and in this case, it is not necessary to intermittently send the request signal from the communicator 16 to determine whether or not the welcome illumination is necessary.

Accordingly, it is possible to reduce power consumption of the vehicle 1.

Figure 8:
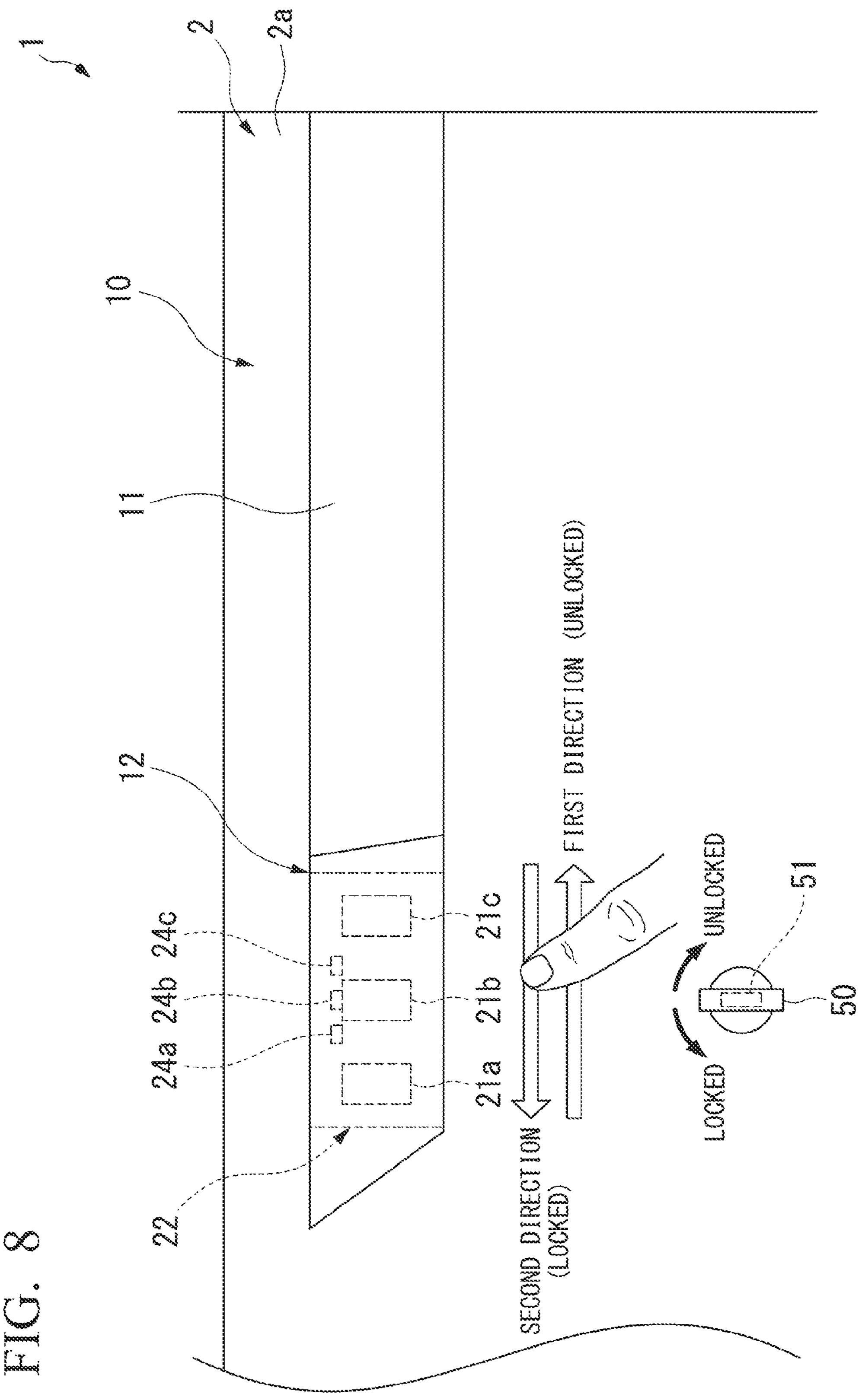
FIG. 8 is a view showing a detection part, a door handle, and a key cylinder of a lock control device for a vehicle according to a first modified example of the embodiment of the present invention.

Moreover, in the above-described embodiment, for example, as a lock control device 10 for a vehicle according to a first modified example shown in FIG. 8 of the above-described embodiment, a key cylinder 51, which is capable of inserting a mechanical key 50 for operating the door lock device 13 by mechanical rotation, may be provided on the outer plate 2*a* of the door 2.

In the first modified example, a corresponding relationship between the rotation direction of the mechanical key 50 and the unlocked state and the locked state of the door lock device 13, and a corresponding relationship between the first direction and the second direction (that is, with respect to the sensor array, the direction of the contact movement of the predetermined detection object in the first direction and the direction of the contact movement of the predetermined detection object in the second direction 22) in the longitudinal direction of the door handle 11, and the unlocked state and the locked state of the door lock device 13 are set to be the same as each other.

According to the first modified example, an operator which uses the mechanical key 50 together can easily understand the operation method of the door lock device 13 and can easily memorize the operation method.

Figure 9:
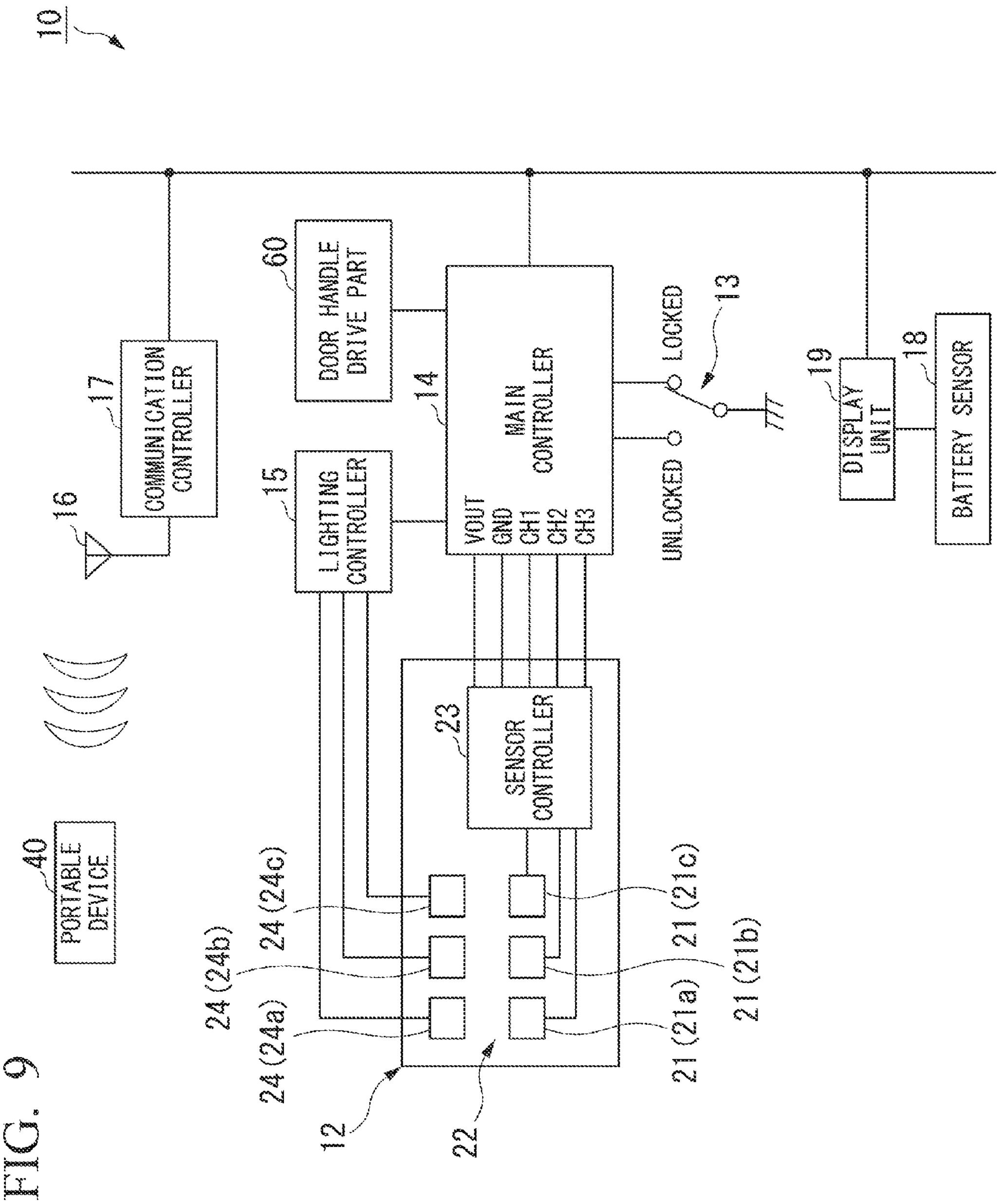
FIG. 9 is a configuration view of a lock control device for a vehicle according to a second modified example of the embodiment of the present invention.

Moreover, in the above-described embodiment, for example, as a lock control device 10 for a vehicle according to a second modified example shown in FIG. 9 of the above-described embodiment, a door handle drive part 60 which changes the door handle 11 from the accommodation state to the holdable state may be provided.

In the second modified example, when the first, second, and third contact detection sensors 21*a*, 21*b*, and 21*c* sequentially detect the contact between the predetermined detection object and the contact detection sensors in the direction along the first direction from the sensor array 22 toward the door handle 11, the main controller 14 changes the door handle 11 from the accommodation state to the holdable state by the door handle drive part 60.

According to the second modified example, since the holding part 11*a* of the door handle 11 protrudes from the outer plate 2*a* of the door 2 when the slide operation is detected in the detection part 12 for unlocking the door lock device 13, it is possible to improve antitheft performance.

Moreover, in the above-described second modified example, when the third, second, and first contact detection sensors 21*c*, 21*b*, and 21*a* sequentially detect the contact between the predetermined detection object and the contact detection sensors in the direction along the second direction opposite to the first direction from the sensor array 22 toward the door handle 11, the main controller 14 may change the door handle 11 from the holdable state to the accommodation state by the door handle drive part 60.

In this case, for example, the door lock device 13 is unlocked by the contact between the predetermined detection object and the sensors in the direction along the first direction. However, when the door 2 is not opened and the door lock device 13 is locked by the contact between the predetermined detection object and the sensors in the direction along the second direction again, the door handle 11 is automatically transferred to the accommodation state, and thus, it is possible to improve convenience.

Hereinbefore, the above-described embodiments are only example embodiments of the present invention, and it is needless to say that the present invention should not be limited to and interpreted by only the above-described embodiments.

INDUSTRIAL APPLICABILITY

According to the present invention, it is possible to provide a lock control device for a vehicle in which an operator who operates a state of the door lock device can easily understand the operation method and can easily memorize the operation method.

REFERENCE SIGNS LIST

1: vehicle
2: door
2*a*: outer plate
10: lock control device for a vehicle
11: door handle
11*a*: holding part
11*b*: pressing part
12: detection part
13: door lock device
14: main controller
15: lighting controller
17: communication controller (approach detection part)
21: contact detection sensor
22: sensor array
27: light emitting part
30: design part
60: door handle drive part (actuator)
50: mechanical key
51: key cylinder

The invention claimed is:

1. A lock control device for a vehicle, comprising:

a door lock device that is configured to cause a door of the vehicle to be in an unlocked state or a locked state;

a door handle that is provided on an outer plate of the door, and that is configured to be operated in order to allow the door to become an open state from a closed state;

a sensor array that is provided on the outer plate of the door in a vicinity of the door handle and that is arranged with a plurality of contact detection sensors which are capable of detecting a contact with a predetermined detection object; and a controller that is configured to control the door lock device to be in the unlocked state when the contact detection sensors of the sensor array sequentially detect the contact moving in a first direction which is a direction from the sensor array toward the door handle, wherein the plurality of contact detection sensors are arranged in a direction along a longitudinal direction of the door handle, wherein the sensor array is arranged at a second direction-side of the outer plate of the door adjacent to the door handle, the second direction being a direction opposite to the first direction, and wherein the sensor array and the door handle are arranged next to each other along the longitudinal direction.

2. The lock control device according to claim 1, wherein the controller is configured to control the door lock device to be in the locked state when the contact detection sensors sequentially detect the contact moving in the second direction.

3. The lock control device according to claim 2, further comprising:

a key cylinder into which a mechanical key which operates the door lock device by mechanical rotation can be inserted, the key cylinder being arranged on the outer plate of the door, wherein a corresponding relationship between a rotation direction of the mechanical key, and the unlocked state and the locked state of the door lock device, and a corresponding relationship between the first direction and the second direction, and the unlocked state and the locked state of the door lock device, are configured to be same as each other.

4. The lock control device according to claim 1, wherein the door handle is configured to be changeable between an accommodation state and a holdable state, and includes a pressing part which is configured to change the holding part from the accommodation state to the holdable state, the accommodation state being a state in which a holding part held during operation is accommodated in the outer plate of the door, the holdable state being a state in which the holding part protrudes from the outer plate of the door so as to be held, the pressing part being arranged on an end part of the door handle which is at a side closer to the sensor array in the longitudinal direction.

5. The lock control device according to claim 1, wherein the door handle is configured to be changeable between an accommodation state, and a holdable state, and includes an actuator which is configured to change the holding part from the accommodation state to the holdable state, the accommodation state being a state in which a holding part held during operation is accommodated in the outer plate of the door, the holdable state being a state in which the holding part is protruded from the outer plate of the door so as to be held, and wherein the controller is configured to change the actuator to be in the holdable state when the contact detection sensors sequentially detect the contact moving in the first direction.

6. The lock control device according to claim 1, further comprising:

a light emitting part that is configured to emit light which is visible from outside the vehicle, the light emitting part being arranged in a vicinity of the sensor array, wherein the controller is configured to cause the light emitting part to emit light with different colors associated with the unlocked state and the locked state in advance for a predetermined period of time after the controller has performed the control of the door lock device to be in the unlocked state or the locked state.

7. The lock control device according to claim 1, further comprising:

a light emitting part that is arranged in a vicinity of the sensor array and that is configured to emit light which is visible from outside the vehicle; and an approach detection part that is configured to detect that a portable device has approached the vehicle, wherein the controller is configured to cause the light emitting part to emit light when the approach detection part detects that the portable device has approached the vehicle.

8. The lock control device according to claim 1, wherein the sensor array is arranged on a surface of the outer plate of the door in the vicinity of the door handle.

9. The lock control device according to claim 1, wherein the sensor array is arranged on the outer plate of the door other than on the door handle in the vicinity of the door handle.

10. A lock control device for a vehicle, comprising:

a door lock device that is configured to cause a door of the vehicle to be in an unlocked state or a locked state;

a door handle that is provided on an outer plate of the door, and that is configured to be operated in order to allow the door to become an open state from a closed state;

a sensor array that is provided on the outer plate of the door in a vicinity of the door handle and that is arranged with a plurality of contact detection sensors which are capable of detecting a contact with a predetermined detection object;

a controller that is configured to control the door lock device to be in the unlocked state when all of the contact detection sensors of the sensor array sequentially detect the contact moving in a first direction which is a direction from the sensor array toward the door handle; and a design part that is configured to display a predetermined design on a front surface of the sensor array by a graphic form or a character, wherein, when viewed from a front of the sensor array, both ends of the design part in a direction along the first direction are arranged at positions that are more outside than both ends of the sensor array in the direction along the first direction.

11. The lock control device according to claim 10, wherein the controller is configured to control the door lock device to be in the locked state when the contact detection sensors sequentially detect the contact moving in a second direction which is a direction opposite to the first direction.

12. The lock control device according to claim 11, further comprising:

a key cylinder into which a mechanical key which operates the door lock device by mechanical rotation can be inserted, the key cylinder being arranged on the outer plate of the door, wherein a corresponding relationship between a rotation direction of the mechanical key, and the unlocked state and the locked state of the door lock device, and a corresponding relationship between the first direction and the second direction, and the unlocked state and the locked state of the door lock device are configured to be same as each other.

13. The lock control device according to claim 10, wherein the door handle is configured to be changeable between an accommodation state and a holdable state, and includes a pressing part which is configured to change the holding part from the accommodation state to the holdable state, the accommodation state being a state in which a holding part held during operation is accommodated in the outer plate of the door, the holdable state being a state in which the holding part protrudes from the outer plate of the door so as to be held, the pressing part being arranged on an end part of the door handle which is at a side closer to the sensor array in a longitudinal direction.

14. The lock control device according to claim 10, wherein the door handle is configured to be changeable between an accommodation state, and a holdable state, and includes an actuator which is configured to change the holding part from the accommodation state to the holdable state, the accommodation state being a state in which a holding part held during operation is accommodated in the outer plate of the door, the holdable state being a state in which the holding part is protruded from the outer plate of the door so as to be held, and wherein the controller is configured to change the actuator to be in the holdable state when the contact detection sensors sequentially detect the contact moving in the first direction.

15. The lock control device according to claim 10, further comprising:

a light emitting part that is configured to emit light which is visible from outside the vehicle, the light emitting part being arranged in a vicinity of the sensor array, wherein the controller is configured to cause the light emitting part to emit light with different colors associated with the unlocked state and the locked state in advance for a predetermined period of time after the controller has performed the control of the door lock device to be in the unlocked state or the locked state.

16. The lock control device according to claim 10, further comprising:

a light emitting part that is arranged in a vicinity of the sensor array and that is configured to emit light which is visible from outside the vehicle; and an approach detection part that is configured to detect that a portable device has approached the vehicle, wherein the controller is configured to cause the light emitting part to emit light when the approach detection part detects that the portable device has approached the vehicle.

17. The lock control device according to claim 10, wherein the sensor array is arranged on a surface of the outer plate of the door in the vicinity of the door handle.

18. The lock control device according to claim 10, wherein the sensor array is arranged on the outer plate of the door other than on the door handle in the vicinity of the door handle.

* * * * *